(12) United States Patent
Boduch et al.

(10) Patent No.: US 10,955,468 B2
(45) Date of Patent: Mar. 23, 2021

(54) WAFER PROBE RESUMPTION OF DIE TESTING

(71) Applicant: Texas Instruments Incorporated, Dallas, TX (US)

(72) Inventors: Joseph Anthony Boduch, Frisco, TX (US); Romano Schmidt, Dachau (DE)

(73) Assignee: Texas Instruments Incorporated, Dallas, TX (US)

( * ) Notice: Subject to any disclaimer, the term of this patent is extended or adjusted under 35 U.S.C. 154(b) by 100 days.

(21) Appl. No.: 16/254,435

(22) Filed: Jan. 22, 2019

(65) Prior Publication Data

US 2019/0227116 A1 Jul. 25, 2019

Related U.S. Application Data

(60) Provisional application No. 62/620,750, filed on Jan. 23, 2018.

(51) Int. Cl.
*G01R 31/28* (2006.01)

(52) U.S. Cl.
CPC ..... *G01R 31/2886* (2013.01); *G01R 31/2831* (2013.01); *G01R 31/2834* (2013.01)

(58) Field of Classification Search
CPC ............ G01R 31/2831; G01R 31/2834; G01R 31/2893; G01R 31/26; G01R 31/318511; G01R 1/0491; G01R 31/2886; G01R 31/287; G01R 31/311; G01R 1/06711; G01R 31/2868; G01R 31/2884; G01R 31/31718; G01R 31/3177; G01R 1/06794; G01R 31/2642; G01R 31/2832; G01R 31/31835; G01R 31/31907; G01R 31/31908; G06F 30/398; G06F 30/394; G06F 2111/20; G06F 11/079; G06F 30/3323; G06F 9/30003; G06K 9/4604; G06K 9/6231; H01L 22/20

See application file for complete search history.

(56) References Cited

U.S. PATENT DOCUMENTS

| | | | | |
|---|---|---|---|---|
| 6,043,101 A * | 3/2000 | Stubblefield | ....... | G01R 31/2834 209/573 |
| 6,549,863 B1 * | 4/2003 | Morinaga | .......... | G01R 31/2851 702/104 |
| 6,639,418 B2 * | 10/2003 | Tseng | ....................... | G01R 3/00 324/750.03 |
| 6,828,776 B2 * | 12/2004 | Tai | ..................... | G01R 31/2831 324/762.05 |
| 6,834,246 B2 * | 12/2004 | Stubblefield | ....... | G01R 31/2831 324/754.03 |
| 7,148,716 B2 | 12/2006 | Schuette et al. | | |

(Continued)

*Primary Examiner* — Vinh P Nguyen
(74) *Attorney, Agent, or Firm* — Rose Alyssa Keagy; Charles A. Brill; Frank D. Cimino

(57) ABSTRACT

Wafer test control and methodologies are provided for resuming the probing of a wafer, in connection with random, distributed or statistical wafer probing. The resumption of testing may occur after an interruption of a previous probe of the wafer and removal of the wafer from a testing chuck. Parameter settings are retained in addition to probe results from the previous wafer probe session in order to construct a resume probe map according to applicable probing rules and conditions. Wafer probing may be restarted according to the resume probe map.

20 Claims, 7 Drawing Sheets

(56) References Cited

U.S. PATENT DOCUMENTS

| | | | |
|---|---|---|---|
| 7,271,609 B2* | 9/2007 | Liao | G01R 31/2894 324/754.03 |
| 7,323,899 B2 | 1/2008 | Schuette et al. | |
| 7,453,261 B1* | 11/2008 | Mark | G01R 31/2894 324/754.03 |
| 7,533,313 B1* | 5/2009 | Retersdorf | G01R 31/31718 714/724 |
| 7,715,997 B2* | 5/2010 | Long | H01L 22/12 702/81 |
| 2004/0034493 A1 | 2/2004 | Stubblefield et al. | |

* cited by examiner

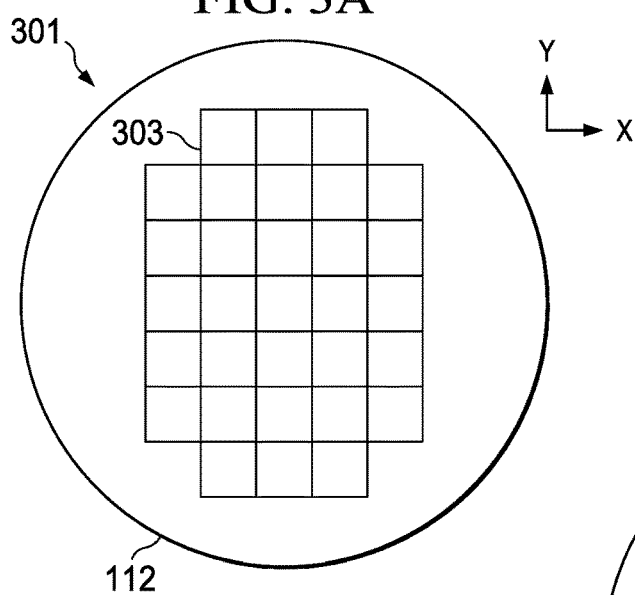
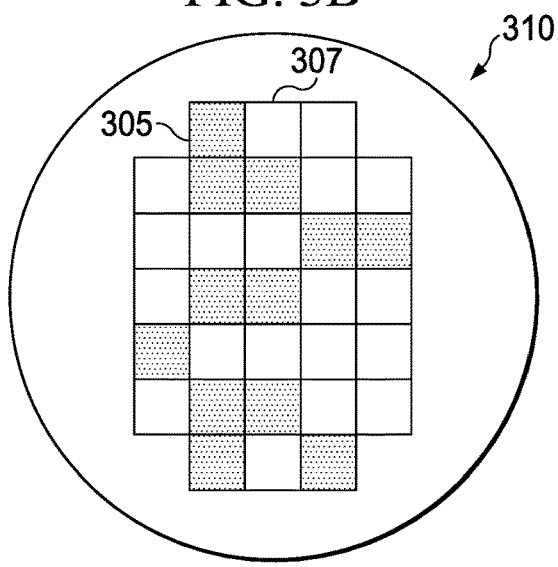
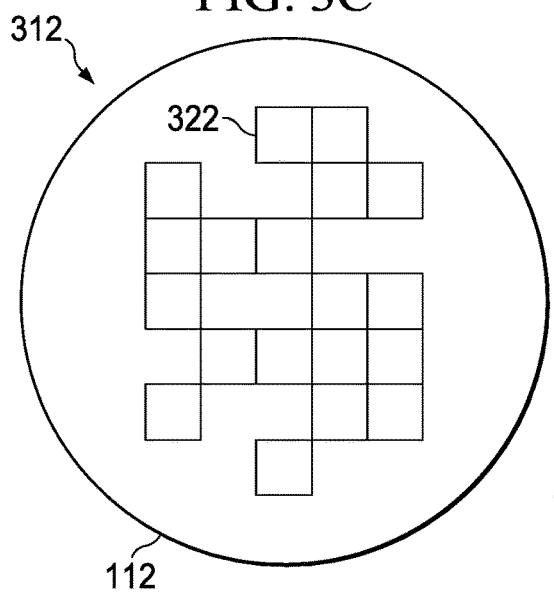
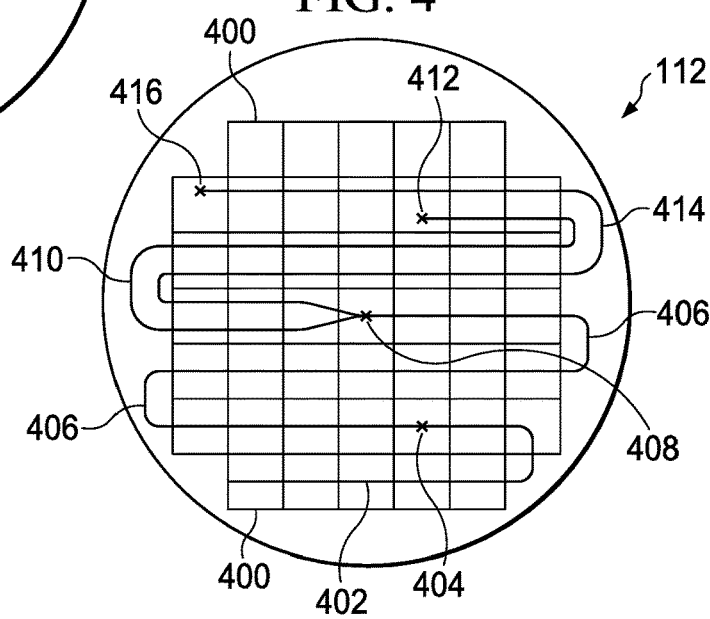

WAFER PROBE RESUMPTION OF DIE TESTING

CROSS-REFERENCE TO RELATED APPLICATION(S)

The present application claims priority to U.S. Provisional Patent Application No. 62/620,750 filed on Jan. 23, 2018, entitled "MULTI-MODE RESUME CAPABILITY OF TESTWARES ADAPTIVE GOOD SAMPLE PROBE (GSP)" the entire disclosure of which is incorporated by reference herein.

BACKGROUND OF THE INVENTION

An array of die, which may include integrated circuits and their components, may be supported on a wafer during various semiconductor fabrication processes. At various stages during fabrication processes, it may be desirable to perform testing on the die to read information from the die, write information to the die, or otherwise gather information about various die and components on various die. During testing, a probe map is downloaded to a prober which is used by the prober to position the wafer to sequentially align die on the wafer with testing equipment.

Although it is generally desirable to test die on the wafer in a single pass, or probing session, in certain situations, a probing session may be aborted before all of the intended die for testing on the wafer are tested. For example, a single probing session may require several hours of testing time. If a lot of higher priority wafers is received in the fabrication facility, a probing session of a lower priority wafer already underway may be aborted in favor of testing the lot of higher priority wafers. In such a case, an operator of the probing and testing equipment may manually abort the probing session of the lower priority wafer. In other examples, a probing session may be automatically aborted in connection with the occurrence of an unplanned event such as a test program crash. Regardless of the cause, when a probing session is aborted, the time spent performing the probing session and the data gathered from the probing session are lost. A later probing session requires the retesting of any already probed die on the wafer to regenerate the lost data. Because each probing session of a wafer results in wear to each die tested on the wafer, multiple probing sessions performed on the same areas of a wafer may degrade the integrity of the wafer.

A wafer testing system may intelligently probe a wafer based on a generated map, a probe map, incorporating previous probe passes to influence which die need to be tested, retested or excluded from test. The probe map sets forth, among other things, the locations, on a wafer, to be probed. The system also has the ability to resume from an aborted probe by saving probed data, collected prior to an abort, in a database. This data can be recalled at a later time to generate a resume map. The resume map is the original probe map minus the devices already tested. Currently, most wafer probing systems involve testing all of the die on a wafer.

For wafer test systems involving tests of less than all die on a wafer, resuming testing presents a challenge since data placed in a database from previous test on an incomplete testing run abort is lost. With existing systems, the aborted partial data in the database will need to be removed and the entire die testing run for the wafer must start from the beginning. Consequently, all testing prior to the abort is wasted, providing no information to properly resume testing after an abort. Data concerning the random map generated for wafer probing and the multiple iterative probing possibly used in testing is lost during the abortion of the test.

Based on the foregoing, there is a need in the art to develop a method and system enabling a successful testing of die after an aborted wafer probe which will accommodate die testing, according to a statistical testing distribution, of less than all die on a production lot of wafers

SUMMARY

Wafer test control and methodologies are provided herein for resuming the probing of a wafer, in connection with random, distributed or statistical wafer probing, following an interruption of a previous probe. The method includes the following steps:
(a) receiving parameter settings corresponding to one or more previous probes;
(b) receiving probe map making rules;
(c) collecting probe data corresponding to the one or more previous probes;
(d) checking for yield data exceptions;
(e) checking for limit value exceptions;
(f) generating a resume probe map subject to probe map making rules concerning yield data and limit value exceptions; and
(g) probing the wafer according to the resume probe map.

The foregoing, and other features and advantages herein will be apparent from the following, more particular description, the accompanying drawings, and the claims.

BRIEF DESCRIPTION OF THE DRAWINGS

For a more complete understanding of the present disclosure, the objects and advantages thereof, reference is now made to the ensuing descriptions taken in connection with the accompanying drawings briefly described as follows.

FIGS. 3A-3C illustrate example probe maps generated for a wafer.

FIG. 4 illustrates an example probe map in which multiple probing sessions have been initiated and then aborted before probing of the wafer is complete.

Figure 1:
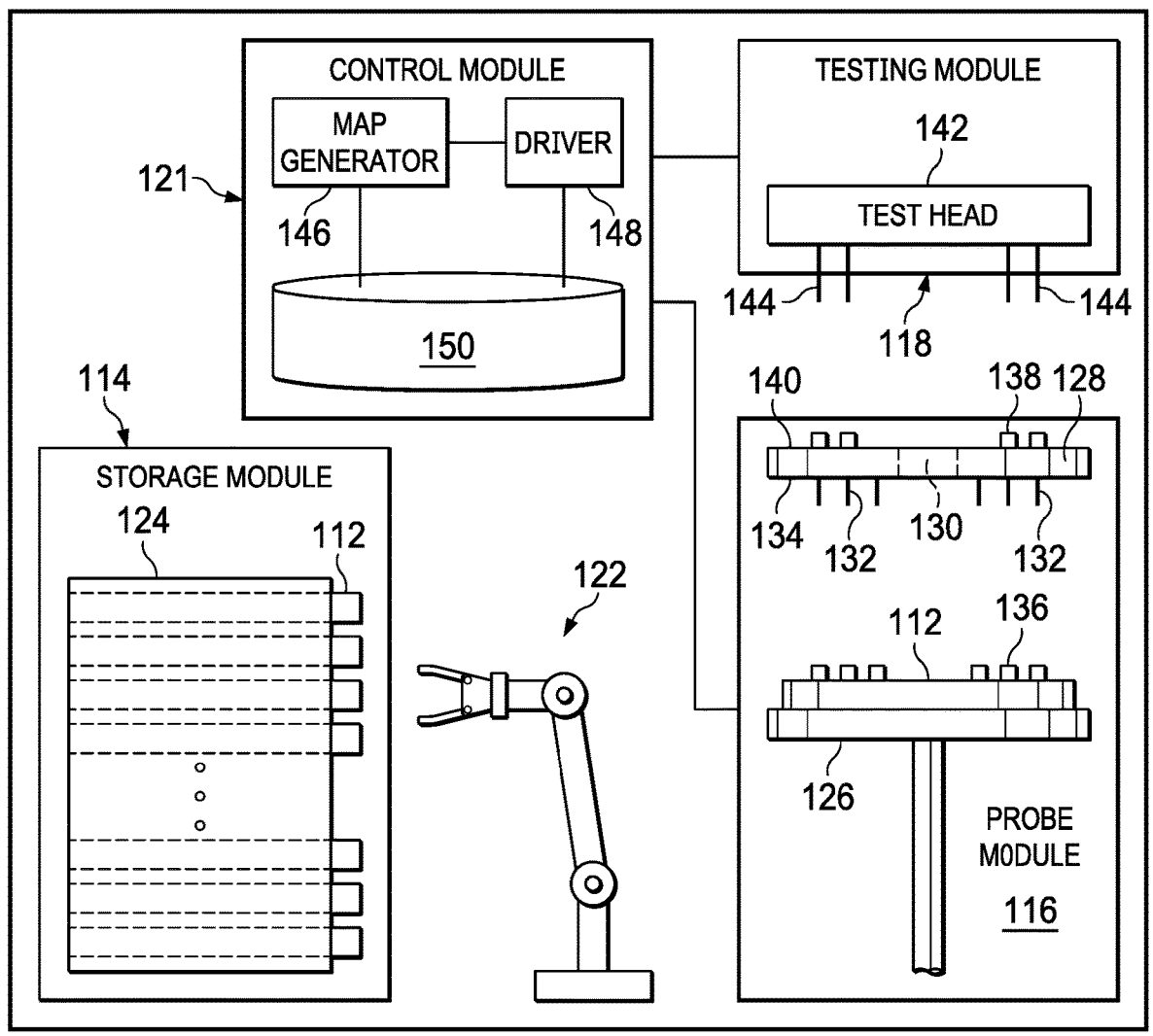
FIG. 1 is a block diagram of a system for the probing of a wafer after one or more partial probing sessions have been aborted.

Examples presented herein and their advantages may be understood by referring to FIGS. 1-8, wherein reference numerals have been carried forward.

DETAILED DESCRIPTION

FIG. 1 is a block diagram of system 110 for the probing of a wafer 112 after one or more partial probing sessions have been aborted. System 110 may employ software providing TestWare active control (TWAC) using a method of intelligently probing a wafer based on a generated map incorporating previous probe passes to influence which die need to be tested, retested or excluded from test. The TWAC software employed by system 110 may be, for example, a custom software suite of tools that support specification control/enforcement, test data collection, intelligent probing, and post probe outlier analysis Rules (also referred to as Active Control Rules or AC_RULES) are defined and pulled from stored data to determine how system 110 generates a probe map using a computer implemented function, gsp_map. In various examples, wafer 112 may include a thin polished slice of crystal material sliced from a crystal cylinder grown for the purpose of semiconductor fabrication. A wafer may be several inches in diameter and provide the foundation on which a semiconductor device may be created. The semiconductor device may be created on the surface of the wafer using a variety of techniques and procedures, such as layering, photolithographic patterning, doping through implantation of ionic impurities, and heating. The starting material may comprise silicon, gallium arsenide, or another suitable substrate material. As will be described in further detail below, system 110 includes a storage module 114, a probe module 116, a testing module 118, and a control module 121 and may include any other modules appropriate for the gathering of testing data about the one or more die on wafer 112. In particular examples, the different modules of system 110 cooperate to read data from, write data to, or otherwise gather information about each die on wafer 112, system 110 also includes a transfer assembly 122 for transporting wafer 112 between storage module 114 and probe module 116. Storage, as used herein, includes storage in one or more wafer cassettes or in an inspection tray. Some test setups have testers that can drive multiple probers. Transfer assembly 122 may also be used to transport wafer 112 between other modules and components of system 110 and between system 110 and other semi-conductor fabrication systems (not shown).

Prior to the probing process, wafer 112 may be stored in storage module 114. Specifically, wafer 112 may be stored in one or more cassettes 124 within storage module 114. A cassette 124 may include any apparatus suitable for storing wafer 112 while undergoing or awaiting isolated semiconductor device production processes in system 110 and/or other components of semiconductor fabrication systems. In particular examples, cassette 124 may include multiple slots for horizontally storing stacked wafers. For example, cassette 124 may include twenty-five slots for storing twenty-five wafers. The described configuration of cassette 124, however, is merely exemplary. Cassette 124 may be of any configuration appropriate for storing any desired number of wafers. Although cassette 124 and storage module 114 are used to store wafer 112 while wafer 112 awaits probing and testing, cassette 124 and storage module 114 may also be used to store wafer 112 as wafer 112 undergoes other fabrication processes outside of system 110.

System 110 includes a transfer assembly 122 or other apparatus for mechanically or robotically moving wafer 112 from one component to another component in system 110. In various examples, transfer assembly 122 transports wafer 112 from storage module 114 to probe module 116. Probe module 116 includes a chuck 126 on which wafer 112 may be placed by transfer assembly 122. Chuck 126 includes a supportive structure that may be mechanically or robotically operated to move horizontally and vertically within probe module 116. A vacuum or other force may be applied to wafer 112 through chuck 126 to hold wafer 112 on chuck 126 while wafer 112 is in probe module 116. In operation, chuck 126 may be moved to position wafer 112 into a testing position such that data may be retrieved from or imported to wafer 112. More specifically, chuck 126 may be moved to sequentially position each die on wafer 112 in the testing position.

In the testing position, wafer 112 is positioned beneath a probe card 128 that includes circuitry components enabling probe card 128 to operate as an interface between wafer 112 and testing equipment in testing module 118. Probe card 128 may be at a fixed location within probe module 116. Transfer assembly 122 may position wafer 112 in the testing position such that a particular die on wafer 112 is aligned with or positioned proximate to probe card 128. In particular examples, one or more pins 132 may extend from a first surface 134 of probe card 128 along an edge of aperture 130. In the testing position, each pin 132 contacts an associated contact pads 136 on the particular die being tested. At any one time, the contact pads 136 contacting pins 132 during a probing session are associated with a particular die on wafer 112 that is undergoing testing during the probing session. Accordingly, contact pads 136 of wafer 112 and pins 132 of probe card 128 cooperate to operate as an interface between probe card 128 and the particular die on wafer 112 undergoing testing.

Probe card 128 also includes one or more probe card contact pads 138 supported on a second surface 140 of probe card 128. Probe card contact pads 138 operate as an interface between probe card 128 and one or more components of testing module 118. Accordingly, probe card 128 acts an intermediary between wafer 112 and testing module 118. Although probe card 128 is described as comprising a substantially round component that includes an aperture 130 configured through the probe card 128, the configuration of probe card 128 may be dependent upon the particular type of wafer 112 undergoing probing. As a result, it is generally recognized that probe card 128 may be of any appropriate size, shape, and configuration for providing an interface between each die supported on wafer 112 and the components of testing module 118.

In particular examples, probe card contact pads 138 operate as an interface between probe card 128 and a test head 142 of testing module 118. Test head 142 includes one or more retractable pins 144 that extend from test head 142 and probe card contact pads 138 of probe card 128. Pins 144 allow test head 142 to gather information about each die supported on wafer 112. Thus, test head 142 may be used to read data from, write data to, and/or otherwise gather information about each die on wafer 112. For example, test head 142 may perform a functional test to determine whether each die is operating correctly. Alternatively, or additionally, test head 142 may determine a stand-by current associated with each die supported on wafer 112. In particular examples, the stand-by current may be a measure of the amount of current leaking from the particular die in a stand-by mode of operation.

System 110 also includes control module 121 that communicates with testing module 118 and probe module 116. In the illustrated example, control module 121 includes a map generator 146, a driver 148, and a relational database 150. Relational database 150 stores information in data sets that are associated with different wafers. The data sets may be indexed by identifiers particular to each wafer 112. In particular examples, the wafer identifier may be written to the surface of wafer 112 and may include a series of numbers, letters, and/or symbols. The wafer identifier may be used to track wafer 112 through the various semiconductor fabrication processes. Additionally, when a wafer 112 is received at probe module 116, control module 121 may read the wafer identifier from wafer 112 and may then look for an entry or data set corresponding with the wafer identifier in relational database 150. The data set associated with the wafer 112 may include information relating to the physical positions of each die supported on wafer 112. The data set may also include testing data gathered during previous probing sessions that were initiated on wafer 112 but were then aborted before the probing of every die on wafer 112 was completed. The prior probing sessions may have been performed by probe module 116 or by a probing system outside of system 110.

In particular examples, the data set associated with each wafer 112 may also include one or more flags indicating to control module 121 that wafer 112 was the subject of prior probing sessions, that testing data was obtained during these prior probing sessions, and/or that the testing data is usable. Testing data may not be usable where the prior probing session was aborted because of a continuity fail. A continuity fail occurs when the testing equipment is unable to properly contact the particular die being tested on wafer 112. For example, where pins 132 on probe card 128 are bent or otherwise do not make contact with contact pads 136 on the particular die on wafer 112 that is being tested, the testing data may be unusable.

From the data stored in the data sets in relational database 150 or from data gathered directly from wafer 112 or another database outside of system 110, map generator 146 generates a probe map of wafer 112. The probe map may include a depiction or representation of all die supported on wafer 112. In particular examples, a probe map that includes a physical representation may be presented to an operator of system 110 on a computer monitor or other graphical user interface coupled to system 110. The operator may then be able to make decisions about the probing session before or after the probing session is initiated. Alternatively, control module 121 may use the representation to drive the probing session. In other examples, the probe map may include a listing of the coordinates associated with each die on wafer 112, rather than an actual physical representation of wafer 112. The listing of coordinates may also be presented to the operator of system 110 or the listing may be used by control module 121, which directs or drives the probing session. Example probe maps are discussed below with regard to FIGS. 3A-3C.

As discussed above, control module 121 also includes a driver 148. Driver 148 is used to control or drive the operations of probe module 116. Accordingly, driver 148 includes the software necessary to generate and communicate commands to probe module 116. The commands communicated to probe module 116 may identify one or more die to be probed on wafer 112. In particular examples, the commands may identify the physical position of the one or more die to be probed using coordinates or another position identifier. Because the commands driving probe module 116 are originated at driver 148 of control module 121, at least a portion of the operations performed by probe module 116 are controlled externally from probe module 116. In particular examples and as described below with regard to FIG. 2, driver 148 may allow the operator of system 110 to select the particular die on wafer 112 to be probed when probing of the wafer is resumed. Because control module 121 and, thus, the operator of system 110 has access to information gathered about wafer 112 during previous aborted probing sessions, only the die on wafer 112 that have not been previously probed and tested need be probed in the resumed probing session.

System 110 illustrated and described, herein, is provided as one example of a system for probing wafer 112 after one or more previous probing sessions have been aborted. Accordingly, the foregoing contemplates any configuration appropriate for the external driving and manipulation of a probing and testing equipment. Thus, system 110 may include fewer modules or more modules than those depicted in FIG. 1. For example, any of the described modules or components may be external to system 110 and the testing equipment. Further, although illustrated as a component of control module 121, relational database 150 may be external to system 110 and/or may be accessible to other systems.

Figure 2:
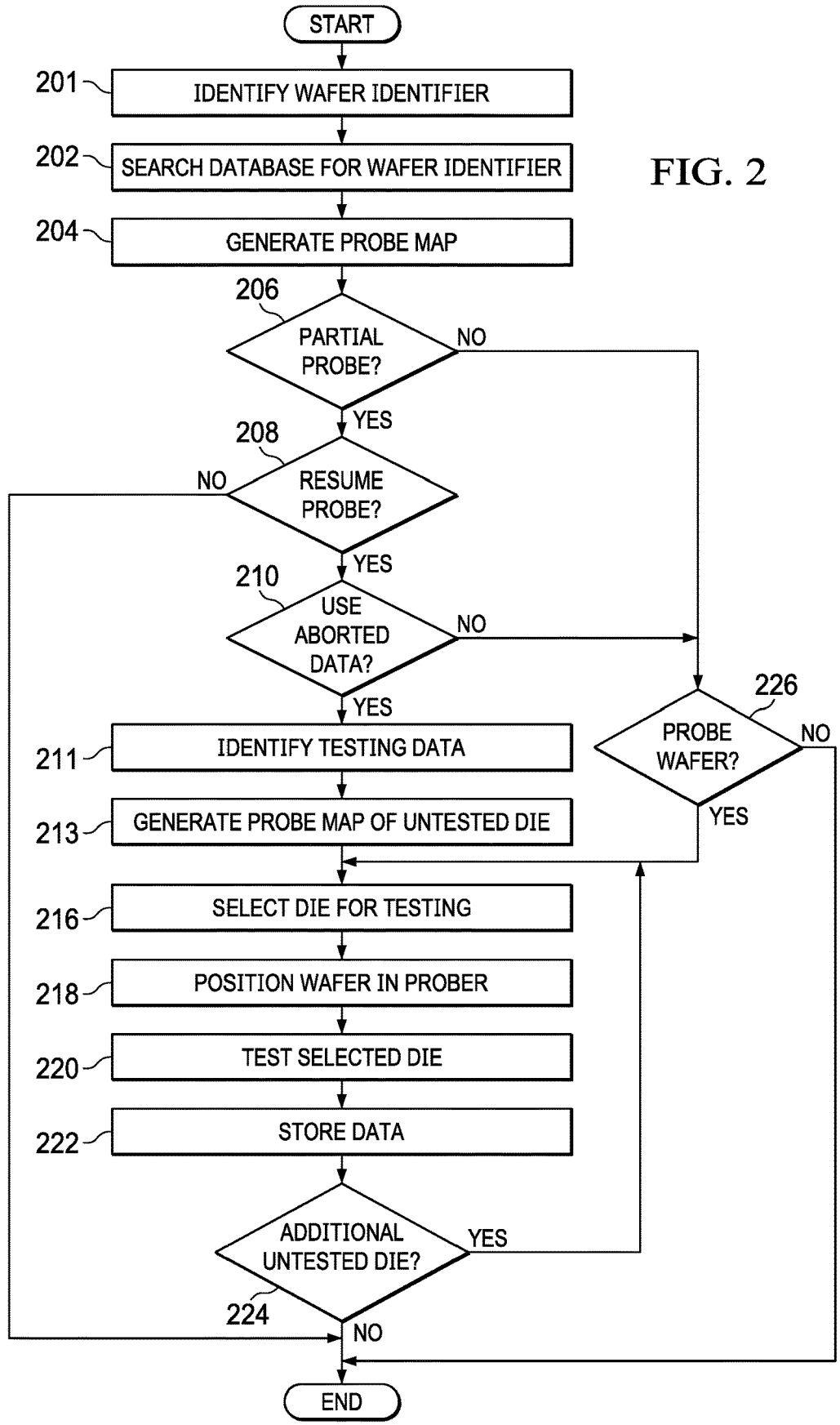
FIG. 2 is a flowchart of a method for the probing of a wafer after one or more partial probing sessions have been aborted.

FIG. 2 is a flowchart of a method for probing a wafer 112, and especially for resuming the probing of wafer 112 after one or more partial probing sessions have been aborted. At step 201, a wafer identifier is identified on the surface of wafer 112. Control module 121 may then search relational database 150 to locate the wafer identifier in relational database 150 at step 202. The wafer identifier may correspond to an entry or data set in relational database 150 that includes information gathered about the wafer 112 during one or more previously aborted probing sessions. At step 204, a probe map is generated to identify the presence and position of all die supported on wafer 112. Map generator 146 of control module 121 may generate the probe map.

FIG. 3A includes an example probe map 301 of wafer 112. Each position 303 on probe map 301 represents the presence of a die on wafer 112. Although probe map 301 is illustrated as a physical representation of wafer 112 and, more specifically, of the positions 303 of the die on wafer 112, probe map 301 may include a listing of coordinates or another position identifier for each die. Each set of coordinates may identify the position of a die supported on wafer 112. For example, in particular examples, an x-coordinate and a y-coordinate may be assigned to each die on wafer 112.

Returning to FIG. 2, a determination may be made at step 206 as to whether wafer 112 has been the subject of one or more partial probing sessions that were aborted before the probing of every die on wafer 112 was completed. The determination may be made by control module 121. In particular examples, control module 121 may identify a first flag in the data set associated with wafer 112. The first flag may indicate to control module 121 that testing data has been aborted for one or more die on wafer 112 in a prior probing session. In other examples, control module 121 may independently determine that testing data in the data set corresponds to one or more die supported on wafer 112.

Where such testing data is identified, the method may continue at step 208 where it is determined whether or not the probing of wafer 112 should be resumed. In particular examples, control module 121 may present the option to an operator of system 110 on a computer monitor or another graphical user interface. Alternatively, control module 121 may independently determine whether the probing of wafer 112 should be resumed in a new probing session based on information in the data set or other information made known to control module 121. If it is determined at step 208 that the probing of wafer 112 should not be resumed, the method terminates. On the other hand, if it is determined that the probing of wafer 112 should be resumed, the method continues to step 210.

At step 210, a determination is made as to whether the testing data gathered during the one or more prior probing sessions and stored in the data set in relational database 150 is usable. The determination may be made by control module 121. In particular examples, control module 121 may identify a second flag in the data set associated with wafer 112. The second flag may indicate to control module 121 that the testing data is usable. The second flag may be included in the data set as a result of an operator determination that the testing data is valid and usable. The operator determination may have been made when the previous probing session was aborted. In other examples, control module 121 may independently determine whether the testing data is usable by examining the testing data or by questioning a current operator of system 110. In still other examples, control module 121 may assume that the testing data is usable and step 210 may be omitted.

If it is determined at step 210 that the testing data is usable, the testing data is identified in the data set at step 211.

FIG. 3B includes an example probe map 310 that differentiates between the one or more die on wafer 112 that have been previously probed and the one or more die on wafer 112 that have not been previously probed. Accordingly, probe map 310 includes probed positions 305 and un-probed positions 307. Probed positions 305 correspond with each die supported on wafer 112 that was probed in one or more previous probing sessions. Additionally, a probed position 305 may also indicate that relational database 150 contains usable testing data for the particular die at probed position 305. Un-probed positions 307 correspond with each die that was not probed in the one or more previous probing sessions and each die for which usable testing data is not stored in relational database 150. Similar to probe map 301, probe map 310 is illustrated as a physical representation of probed positions 305 and un-probed positions 307. Probe map 310 may comprise, however, a listing of coordinates or other position indicators corresponding to probed positions 305 and a listing of the coordinates or other position indicators corresponding to un-probed positions 307. In particular examples, a set of coordinates including an x-coordinate and a y-coordinate may be assigned to each die on wafer 112. Accordingly, probe map 209 may include listings of probed positions 305 and un-probed positions 307, each identified by the appropriate coordinates for the one or more die listed.

Returning to FIG. 2, a probe map of the one or more untested die supported on wafer 112 is generated at step 213.

FIG. 3C includes an example probe map 312 of wafer 112. Each position 322 on probe map 312 represents the presence of a die that has not been probed in a previous aborted probing session or a die for which no usable testing data was obtained in the prior probing session. Accordingly, each position 322 represents only a die on wafer 112 for which testing data is needed. Although probe map 312 is illustrated as a physical representation of positions 322 on wafer 112, in alternative examples, probe map 312 may include a listing of coordinates or other position identifiers corresponding to positions 322 on wafer 112.

Returning to FIG. 2, a die is selected for testing at step 216. In particular examples, control module 121 (shown in FIG. 1) may select a die to be tested from probe map 312. In other examples, control module 121 may present the operator of system 110 (FIG. 1) with the option of selecting the next die to be tested using a computer monitor or another graphical user interface. At step 218, the wafer is positioned in probe module 116. In particular examples, control module 121 may communicate the generated probe map 312 and/or one or more commands to probe module 116. The commands may identify the next die on wafer 112 or the next sequence of two or more die on wafer 112 (FIG. 1) to be tested. In response to receiving probe map 312 and any accompanying commands, chuck 126 of probe module 116 (FIG. 1) may be used to position the selected die in the testing position. As described above with regard to FIG. 1, positioning the selected die in the testing position may include positioning the selected die proximate a probe card 128 such that one or more pins 132 are aligned with and contact pads 136 on the selected die. Accordingly, the testing position may enable probe card 128 to act as an interface between wafer 112 and testing module 118.

At step 220, the selected die is tested. In particular examples, testing module 118 may be used to read data from, write data to, and/or otherwise gather information about the selected die supported on wafer 112. For example, test head 142 (FIG. 1) may perform a functional test to determine whether the selected die is operating properly. Additionally, test head 142 may determine a stand-by current associated with the selected die or may gather other information specific to the selected die. The data gathered during the resumed probing session may be stored in relational database 150 at step 222 (FIG. 2). In particular examples, the testing data may be added to the data set associated with the wafer 112 already stored in relational database 150. Stated differently, the data gathered in the resumed probing session may be added to any data gathered in previous aborted probing sessions.

With reference to FIGS. 1 and 2, at step 224, a determination is made as to whether additional untested die exist on wafer 112. Control module 121 may make the determination by referring to probe map 312 (FIG. 3C) or by querying the operator of system 110. Alternatively, probe module 116 may make the determination by referring to probe map 312 or to any commands communicated from control module 121. Where it is determined that wafer 112 includes additional untested die, the method returns to step 216. The method then cycles through steps 216 through 224 until each untested die on wafer 112 is tested or until the resumed probing session is aborted, whichever occurs first. After each die on wafer 112 is tested or the probing session is aborted, the method terminates.

Returning to step 206, if it is determined at step 206 that wafer 112 has not been the subject of one or more partial probing sessions, the method continues at step 226. Similarly, if at step 210, it is determined that the testing data gathered during the one or more previous aborted probing sessions is not usable, the method continues at step 226. At step 226, it is determined whether wafer 112 is to be probed. Control module 121 may make the determination independently, or control module 121 may make the determination by presenting the option to an operator of system 110 using a computer screen or other graphical user interface. If wafer 112 is to be probed, the method flows to step 216, where a die on wafer 112 is selected for testing. The method then continues, cycling through steps 216 through 224 until each die on wafer 112 is tested or until the probing session is aborted, whichever occurs first. After each die on wafer 112 is tested or the probing session is aborted, the method terminates.

Although example steps are illustrated and described, use of methods are contemplated with additional steps, fewer steps, or different steps, so long as the steps remain appropriate for the probing of a wafer after one or more prior probing sessions have been aborted.

As described above with regard to FIG. 2, a wafer 112 may be the subject of multiple incomplete probing sessions. Thus, multiple probing sessions may be initiated on a wafer 112 and then aborted before the probing of wafer 112 is complete. For each probing session, information may be gathered regarding the one or more die supported on wafer 112. The testing data obtained from each aborted probing session may be merged in relational database 150. Accordingly, the data set for a wafer 112 may include testing data obtained from multiple probe passes. A probe pass identifies the particular die tested during each probing session and the order in which each die was tested. Typically, the order in which each die was tested is determined by the positions of each die on wafer 112.

FIG. 4 illustrates an example probe map in which wafer 112 has been the subject of four partial probing sessions. Accordingly, four probe passes identify the die 400 on wafer 112 that were tested during each of the four probing sessions.

A first probe pass 402 identifies the one or more die 400 that were tested in a first probing session. In the illustrated example, according to FIG. 4, first probe pass 402 indicates that eight of the die 400 were tested during the first partial probing session. First probe pass 402 was aborted at a first termination point 404. Following the termination of the first probing session, the data generated by first pass 402 may be stored in relational database 150 (FIG. 1). As data associated with the testing of the die 400 corresponding to first termination point 404 may be invalid or unusable, a flag may be attached to the data set in relational database 150 to indicate to control module 121 that only the data generated from a certain number of tested die is valid. For the illustrated example, the first seven of die 400 tested during first pass 402 may be indicated as usable.

A second probe pass 406 may indicate, that at some point, the probing of wafer 112 was resumed in a second probing session. Because control module 121 of system 110 is able to identify a data set in relational database 150 that corresponds with wafer 112, the probing of wafer 112 was resumed at die 400 that corresponds to probing the first die after first termination point 404. It is recognized, however, that the probing of wafer 112 may be resumed at any time on other un-probed die 400 on wafer 112. Similar to first probe pass 402, second probe pass 406 identifies the one or more die 400 that were tested in the second probing session. In the illustrated example, the second probing session was terminated at a second termination point 408. Thus, second probe pass 406 indicates that fifteen of the die 400 were probed during the second probing session. The fifteen of the die 400 probed include the particular die corresponding with the first die after first termination point 404 and the die corresponding with second termination point 408. Following the termination of the second probing session, the data generated by second pass 406 may be stored in relational database 150. A flag may be attached to the data set in relational database 150 to indicate to control module 121 that only the data generated from the fifteen of the die 400 tested during second pass 406 is usable.

A third probe pass 410 indicates that at some point the probing of wafer 112 was resumed in a third probing session. Because control module 121 of system 110 is able to identify a data set in relational database 150 that corresponds with wafer 112, the probing of wafer 112 was resumed at a particular die 400 that corresponds to the first die after second termination point 408. It is recognized, however, that the probing of wafer 112 may be resumed at any other un-probed die 400 on wafer 112. Similar to first and second probe passes 402 and 406, third probe pass 410 identifies the one or more die 400 that were tested in the third probing session. In the illustrated example, the third probing session was terminated at a third termination point 412. Thus, third probe pass 410 indicates that thirteen of the die 400 were probed during the third probing session. The thirteen of the die 400 probed include the die corresponding with the first die 400 after second termination point 408 and the die corresponding with third termination point 412. Following the termination of the third probing session, the data generated by third pass 410 may be stored in relational database 150. For example purposes, it may be assumed that third pass 410 was aborted because of a continuity failure or another failure of system 110 that renders the data gathered during third pass 410 unusable. As such, the data gathered for each die 400 tested during the third probing session may be flagged as unusable in the data set stored in relational database 150.

A fourth probe pass 414 indicates that at some point the probing of wafer 112 was resumed in a fourth probing session. Because control module 121 of system 110 is able to identify that the testing data relating to the one or more die tested during the third probing session was unusable, the probing of wafer 112 was again resumed at the particular die 400 corresponding to the first die 400 after second termination point 408. It is recognized, however, that the probing of wafer 112 may be resumed at any other die 300 for which usable testing data is not stored in relational database 150. Similar to first, second, and third probe passes 402, 406 and 410, fourth probe pass 414 identifies the one or more die 400 that were tested in the fourth probing session. In the illustrated example, the fourth probing session was terminated at a fourth termination point 416. Thus, fourth probe pass 414 indicates that seventeen of the die 400 were probed during the fourth probing session. The seventeen of the die 400 probed include the particular die corresponding with the first die 400 after second termination point 408 and the particular die corresponding with fourth termination point 416. Following the termination of the fourth probing session, the data generated by fourth pass 414 may be stored in relational database 150. A flag may be attached to the data set in relational database 150 to indicate to control module 121 that the data generated from the seventeen of the die 400 tested during fourth pass 406 is usable.

The following describes a system and method for probing wafer 112 after one or more prior probing sessions are aborted. As used herein, probing a wafer is considered probing die on a wafer. Although die may be considered as circuits/devices post-dicing of a wafer, as used herein, die on a wafer also references die/devices pre-dicing. System 110 may be implemented on a microprocessor or programmable logic controller (such as a microcontroller) under the control of software. System 110, as described herein, employs a method of intelligently probing a wafer based on a generated map incorporating previous probe passes to influence which die need to be tested, retested or excluded from test. Rules (i.e., A_RULES) are defined and pulled from relational database 150 to determine the mode of how system 110 generates a probe map. The AC_Rules may be manifest in microcontroller register settings or in microcomputer memory for system 110. System 110 also has the ability to resume from an aborted probe by saving data, thus far probed, in database 150 and recalling this data at a later time in connection with generating a resume map. The resume map is the original probe map minus the devices already tested. The system and methods herein include a control module 121 that operates independently of probe module 116 to utilize data that was gathered in earlier aborted probing sessions. Since the data generated from the previously aborted probing sessions may be stored in relational database 150, a probe map may be generated to identify each die that has not been tested and each die for which no usable data is stored. Because relational database 150 may be available to multiple systems for probing and testing of wafer 112, the probing of wafer 112 may be resumed using different probing and testing equipment than that which was used in the prior aborted probing sessions. After multiple partial probing sessions are performed and the probing of wafer 112 is complete, the data gathered from each partial probing session may be merged within a relational database, such as relational database 150 of FIG. 1, for reporting purposes.

The foregoing system has been described with respect to resuming probing operations involving tests of all die on a wafer. A different approach is taken in connection with testing die on a wafer involving statistical sampling wherein all die on a wafer may not get probed. The methods employing these statistical tests for probing may be referred to as "Good Sample Probe" (GSP). As probing of the die represents probing of according to a sample or sampling (statistical or otherwise), the term sample probing (sample probe or sample probe pass) may refer to such probing/testing. GSP may stand alone or it may be a mode of system 110 which allows for sample probing of die/devices on a wafer including sampling a subset of the total number of die/devices on the wafer. The terms die(s) and devices are used interchangeably herein. A GSP event may reference the testing of devices on a wafer in connection with the probing of a subset of the total number of devices on a wafer, especially in connection with an interruption in testing a wafer lot. The GSP probe sampling is randomly generated, but it is distributed across the wafer. Further, probe sampling of a wafer may occur on a statistical basis. The wafer map is divided into a XY grid where each die of the grid is specified in an area, defined by a row and a column number, identified as a cell. The cell corresponds to the location of one or more die on a wafer 112. Such an XY grid is referenced, as shown, in FIG. 3A. During testing, a die is randomly picked from within the cell. At least one die will be sampled in each cell. A GSP RULE, among other things, defines the number of rows and columns of each cell. With regard to die/device(s) under test, the following definitions are pertinent, and the following actions may be taken:

First Pass ($1^{st}$ pass): $1^{st}$ pass refers to the initial testing of a die on a wafer in connection with a completed probe of the die.

Unload: If a device yield falls below the scrap limit or above the yield limit, the wafer may be unloaded from testing. A scrap limit may be defined as a number of defective devices (die) on a wafer causing the wafer to be marked for disposal (in trash or otherwise). Yield limit is a number of good devices tested on a wafer for which the wafer is identified as being acceptable for use. In connection with a high yield (with mature devices), a Fill operation can be done for remaining untested devices.

Blob Probe: Blob probe is a probe to determine the existence of local concentration of bad die (blobs). A Blob test is a procedure that tests die/devices adjacent to a die/device that failed during the initial probe pass. All neighbors of any additional failures are then tested. This cycle is repeated until no new test failures are found. All bad die/devices in close proximity to each other will be tested and marked as bad. If failed devices are found during sampling, a blob probe can be done where all devices surrounding the failing device will be tested. One or more blob probe iterations may be required to successfully surround failing devices with all good tested devices.

Fill: Fill refers to the circumstance where in connection with completion of a probe run (a probe of die on a wafer), including a $1^{st}$ pass and one or more blob probes (the results of which may be iteratively combined) all the remaining untested devices may be filled with a bin value provided according to the GSP RULE stored in relational database 150. Typically, this "fill bin" is a passing value. For mature devices, the remaining die are assumed good based on the high yield of the $1^{st}$ pass sample (sample from the $1^{st}$ pass probe) and blob passes (probing adjacent die that failed testing). It is noted that in some unload action cases (unloaded the wafer from the probing), based on a yield limit according to a GSP Rule, fill may not be performed as per achieving a scrap limit Bin Value: Bin value is a number that represents a count corresponding to a cumulative occurrence of a particular result in connection with a probe. Should a number of successful probe tests occur, the cumulative result may reach a passing bin value. On the other hand, should a number of failed probe tests occur, the cumulative result may reach a failing bin value.

Full Probe: Full probe causes all devices, on a wafer, to be tested. If the number of failed devices during the $1^{st}$ pass sample is substantial, the sample may be subjected to a full probe which results in a probe of all the remaining die on the wafer.

Bin Exceptions: A Full Probe or Unload may be triggered during a $1^{st}$ pass sample or blob probe iteration based on a bin exception. The GSP RULE in relational database 150 may define a bin exception as representing the case where a sample probe is aborted due to the occurrence of a bin value reaching a limit representative of one or more bin exception values. The action taken in response to the occurrence of a bin exception is to re-test the die which prompted the bin exception or clean and retest that die in an effort to get a positive bin result. If the occurrence limit of a specific exception bin value is exceeded, the sample probe (for instance, the $1^{st}$ pass sample or blob iteration) is aborted and the testing is either switched to a full probe of the remaining die on the wafer or the wafer is unloaded from the testing setup, signaling the potential scrapping of that wafer.

GSP run: A GSP run (including the $1^{st}$ pass sample—randomly generated, and subsequent blob passes, full probe, bin exception handling, and fill) is a single run of the wafer being probed. Test data results, including device bin data, may be collected at the end of the run. If the GSP run is aborted, the data may be saved to a database, for the devices being tested, prior to the abort as part of the resume functionality of system 110. However, the GSP run, due to its random map generation and multiple iterations provides no information to properly resume the GSP run. The information passed between the GSP modules across GSP iterations may be accomplished using relational data base 150 which may represent, for instance, a Unix™ shared memory segment on a testing computer. Until now, data would be lost on a GSP run abort (e.g., the wafer tests currently underway are aborted in favor of testing wafers from a higher priority lot of wafers). In present day wafer probing systems, aborted partial data in the database due to aborted testing will need to be removed and the entire GSP run for the wafer must start from the beginning; thus, all testing prior to the abort is wasted.

Instead of deleting previous data as before, the previous data may be used by GSP to determine how to continue probing the map and at the correct state of the GSP run. This may be accomplished in conjunction with expanding the data field set, for parameters saved in connection with a probe pass of data flags, which allows an aborted probe pass to be resumed from any point during testing and at any iterative level of the overall flow.

Figure 5:
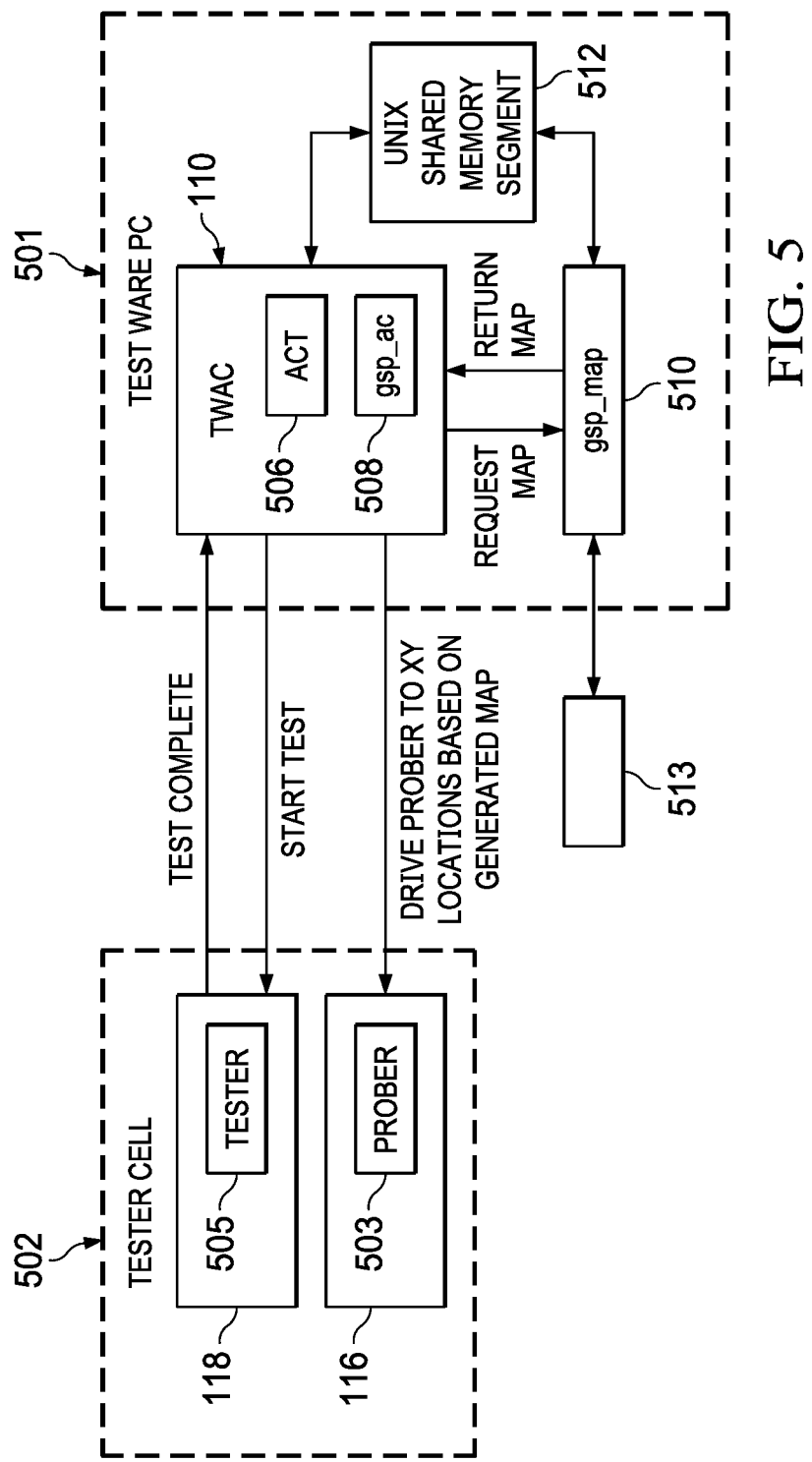
FIG. 5 illustrates a diagram showing the control of a probe system in connection with a GSP event.

FIG. 5 illustrates a functional diagram showing the set-up of a testing device which shall be referred to herein as TWAC system PC 501. TWAC system PC 501 controls a tester cell 502 which includes prober 503 and testing module 118. FIG. 5 details the control of prober 503 in connection with a GSP event. The GSP testing may be accomplished using TWAC system PC 501 which, in fact, may be a microcontroller or a computer system such as a computer system having a UNIX-based computer operating system.

The blocks shown in FIG. 5 are defined as follows:

Prober (503)—Prober 503 is a machine that is part of probe module 116 which indexes a wafer to position devices thereon to be electrically connected to the tester.

Tester (505)—Tester 505 powers up die and runs a myriad of tests on the die and provides a bin result.

Active Probe Controller (ACT) 506—ACT 506 intelligently drives probe module 503 for system 110 to specific wafer locations to be tested based on a generated probe map.

GSP RULE—The GSP RULE (also referred to herein as the AC_Rules) is a set of rules, that may be implanted in software by a computer system or that may be carried out in connection with a microcontroller, which specify yield-based or bin exception-based controls for GSP implementation.

gsp_ac (508)—gsp_ac 508 is a function that provides the decision making for controlling GSP iterations based on yield and bin exception definitions in the GSP RULE. The function determines what the next iteration state will be: (e.g. blob, full probe, unload, etc.). gsp_ac functionality resides within the process carried out by system 110. gsp_ac 508 may be implemented using software, firmware, or hardware in system 110.

gsp_map (510)—gsp_map 510 is a function that may be called externally by TWAC software for each GSP iteration retrieving the GSP_RULE for a device and it builds probe maps, iteratively, based on the state of the iteration, as determined by gsp_ac 508.

The gsp_map 510 function causes the retrieval of the GSP AC_RULE for a wafer and causes a review of the AC_FLAGS bits from the previous pass (if a previous probe pass exists), to allow TWAC 110 to determine how to resume GSP wafer probing. Once the gsp_map 510 function sets up the first probe map for resume, the GSP flow will continue according to the flow shown in FIG. 5.

UNIX shared memory segment (512)—UNIX shared memory segment (512) is a memory used for maintaining tested and failed device information in connection with functions gsp_ac 508 and gsp_map 510 across the iterations of the GSP run. This data is lost once a wafer probe is aborted.

Test result data is unloaded in connection with a wafer unload (from the wafer probing setup) or if the wafer is manually aborted. The resume of the GSP flow requires not only the data of what was probed prior to the abort but also a snapshot of the generated map of die "to be probed" and the current state of the GSP run at the time of the abort. All of this information may be saved in the test results data loaded into a database, referenced herein as a Test Ware (TW) database, such as UNIX shared memory segment 512.

In connection with the test of a wafer, system 110 requests a probe map, which is provided by TWAC system PC 501 through function gsp_map 510. Function gsp_ac 508 sets up the decision making for determining the applicable wafer probing operation whether full probe, blob probe, wafer unload, yield exception or bin exception in connection with data stored memory segment 512 which is shared between the map making and decision-making functionality as enacted by gsp_map 510 and gsp_ac 508, respectively. Function gsp_map 510 returns a map to system 110. System 110 operates tester 505, which may be controlled through testing module 118 (which may be implemented in software or hardware), for operating prober 503. Prober 503 may be controlled through probe module 116 (which may also be implemented in software of hardware for operating prober 503). More specifically, active probe controller (ACT) 506 intelligently operates probe module 503 to probe specific wafer locations to be tested based on a generated probe map created through unction gsp_map 510 in TWAC system PC 501. TWAC 110 initiates the wafer probe and through commands to tester 505. Tester 505 may signal completion of the wafer test back to system 110.

Figure 6:
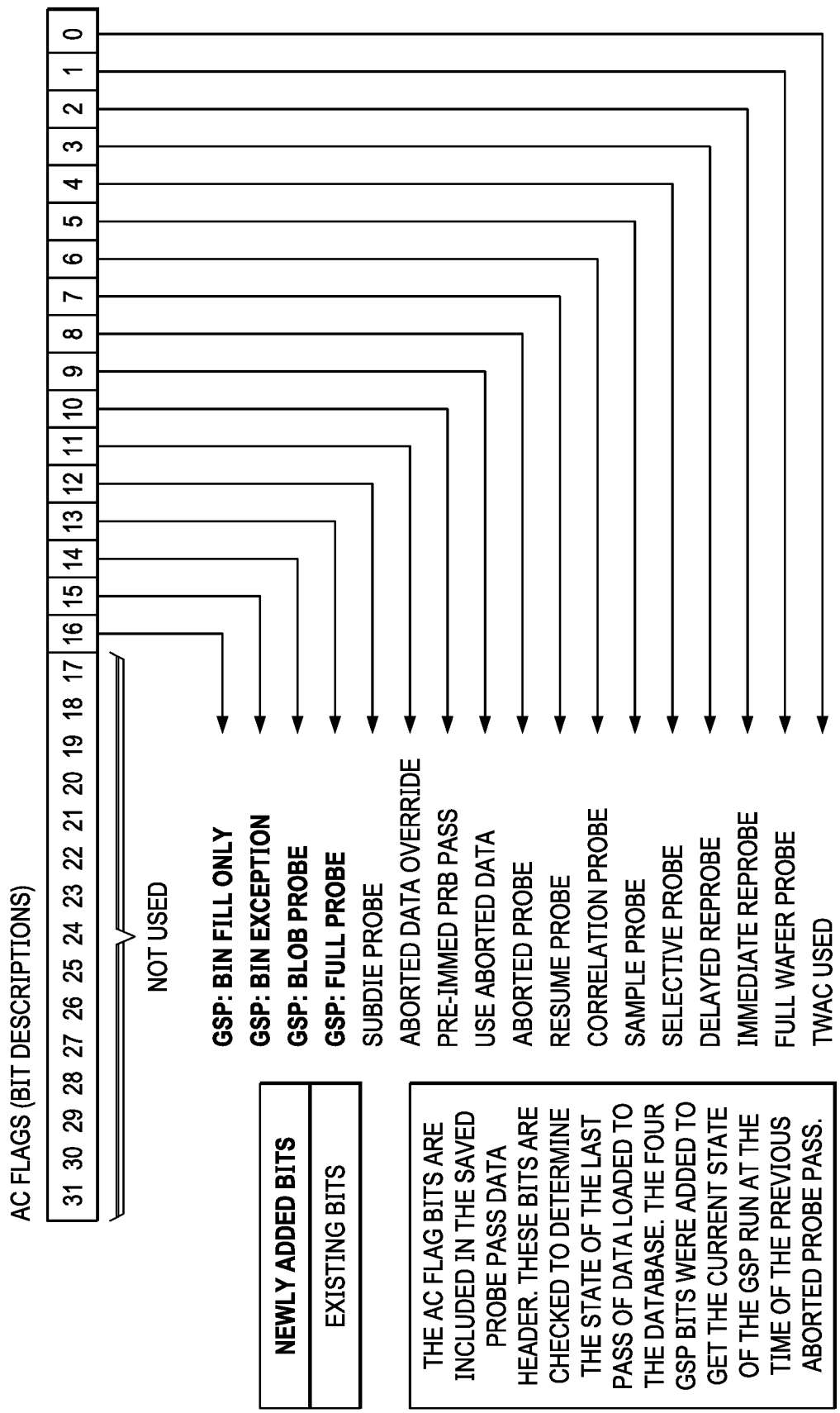
FIG. 6 is a diagram which illustrates bit descriptions for AC_FLAGS.

FIG. 6 is a diagram which illustrates bit descriptions for flags pertaining to active control of the wafer probe, using AC_FLAGs. An AC_FLAG is a 32-bit word containing bits that may be set in a microcontroller register or in the memory of a computer system such as a UNIX shared memory segment 512 (which may exist on a personal computer (PC) (not shown)). With reference to FIG. 6, the bit descriptions shown, and relevant parameters associated therewith, pertain to the following:

AC_FLAGS bits may indicate the type of probing mode for the ACT probe controller 506. ACT probe controller 506 may be implemented as a microcontroller or as a microcomputer with AC_FLAGS serving as, for instance, microcontroller registers or serving as pointers to memory locations in which data is stored. A subset of these bits was unused previous to the introduction of GSP as described herein. At least an additional four bits are now defined indicating the GSP states of probe mode such as blob probe, full probe, full probe pursuant to detecting a bin exception (full probe bin exception), and fill-only. The bits pertaining to the GSP states for a probe may be referred to as GSP bits.

Fill-only may be used when an initial sample probe is run and no subsequent iterations were required due to high yield testing results. For a GSP run to be considered complete, one of more GSP bits (which are indicative of the GSP probe state) must be set on the last probe run iteration. With these state bits set among the AC_FLAGS, UNIX shared memory segment 512 may be queried to check for an aborted pass and to check the state of the GSP run at the time it was aborted.

In the case of a probe interruption, the AC_FLAGS bits are saved. For instance, they may be included in a saved data header, in a database, corresponding to a particular probe iteration (i.e., a probe pass over a wafer under test). These bits are checked to determine the state of the last AC_FLAGS bits loaded to the database. The added GSP bits to the AC_FLAGS bits, (Bin Fill Only, Bin Exception, Blob Probe, and Full Probe) are provided to help ascertain the current state of the GSP run at the time of the previously aborted probe pass.

Test result data sent to the database may contain the AC_FLAGS for a probe pass and a data field for each die, referenced herein as "TW_TOBE_TESTED."

"TW_TOBE_TESTED" (not shown but stored in memory segment 512) is a data parameter for each die (probed or un-probed), that may be used as an AC-FLAGS bit, indicating whether a die is "to be tested" according to a generated probe map for an iteration of die probing. The intended use of this parameter pertains to checking that all die in the map were actually probed. Once the $1^{st}$ pass sample map is aborted, resuming the remainder of a partial sample probe would be extremely difficult. Since the data saved notes all of the potential die to be tested, this parameter may be used to build the resume map for wafer probing of the $1^{st}$ pass sample. Consequently, the $1^{st}$ pass sample may be aborted one or more times and it may be resumed to complete testing according to the original map.

The saving of the GSP state is reflected by the AC_FLAGS bits and the use of the "TW_TOBE_TESTED" parameter for each die allows GSP resume of an abort at any state in the GSP run flow. Even if the abort is during the randomly generated 1$^{st}$ pass sample; the remaining map can be calculated using the "TW_TOBE_TESTED" parameter for the untested die. As compared with what occurs through testing according to existing systems, the foregoing eliminates previously wasted test time in connected with an aborted wafer probe by providing resume capability of the GSP flow as detailed herein.

The following conditions may apply with regard to resuming a probe:

If the AC_FLAGS of the previous data shows blob probe, the blobbing process is deterministic since the method is to test all surrounding devices around the failed device. The resume map would simply include all the untested devices surrounding any fails (i.e., surround fails) from all the previous pass data for the GSP run. In this case, it is not necessary to use the "TW_TOBE_TESTED" data parameter.

If the AC_FLAGS bits from the previous data indicate full probe of remaining devices, a resume map of remaining untested die may be created.

If the Bin Exception AC_FLAG bit was set from a previous aborted full probe pass, the full probe of the wafer may be resumed with the BIN EXCEPTION flag retained until completion of the GSP probe run.

With reference again to FIG. 5, data from a completed 1$^{st}$ pass probe sample may be saved to a database (e.g., memory segment 512). Memory segment 512 may provide a merge of all data from passes in order enable the creation of a resume map from several partial passes of data. The foregoing fundamentally enables the resume capability of the TWAC 110, especially after a probe abort. Data from memory segment 512 may be saved in memory 513 which may be located remotely from the TWAC system PC 501. Shared memory data/data collection during testing may be offloaded to memory 513 (which in some examples may represent a database) at end of a wafer probe pass.

Data is retrieved by gsp_map 510 from either memory segment 512 and/or memory 513. It should be noted that should TWAC system PC 501 crash and should past data from memory segment 512 be unavailable, past probe data may be made available from memory 513 in order to permit completion of a resume map from merged probe pass data.

If the GSP flow is interrupted after a completed 1$^{st}$ pass sample, gsp_map 510 will use the AC_FLAGS bits indicating the pass was completed; run a yield check (normally run by gsp_ac 508 against shared memory) against the previous pass data; and determine what state to resume the GSP probe run flow.

The Fill operation will be run based on the completion of the last resume pass.

Figure 7:
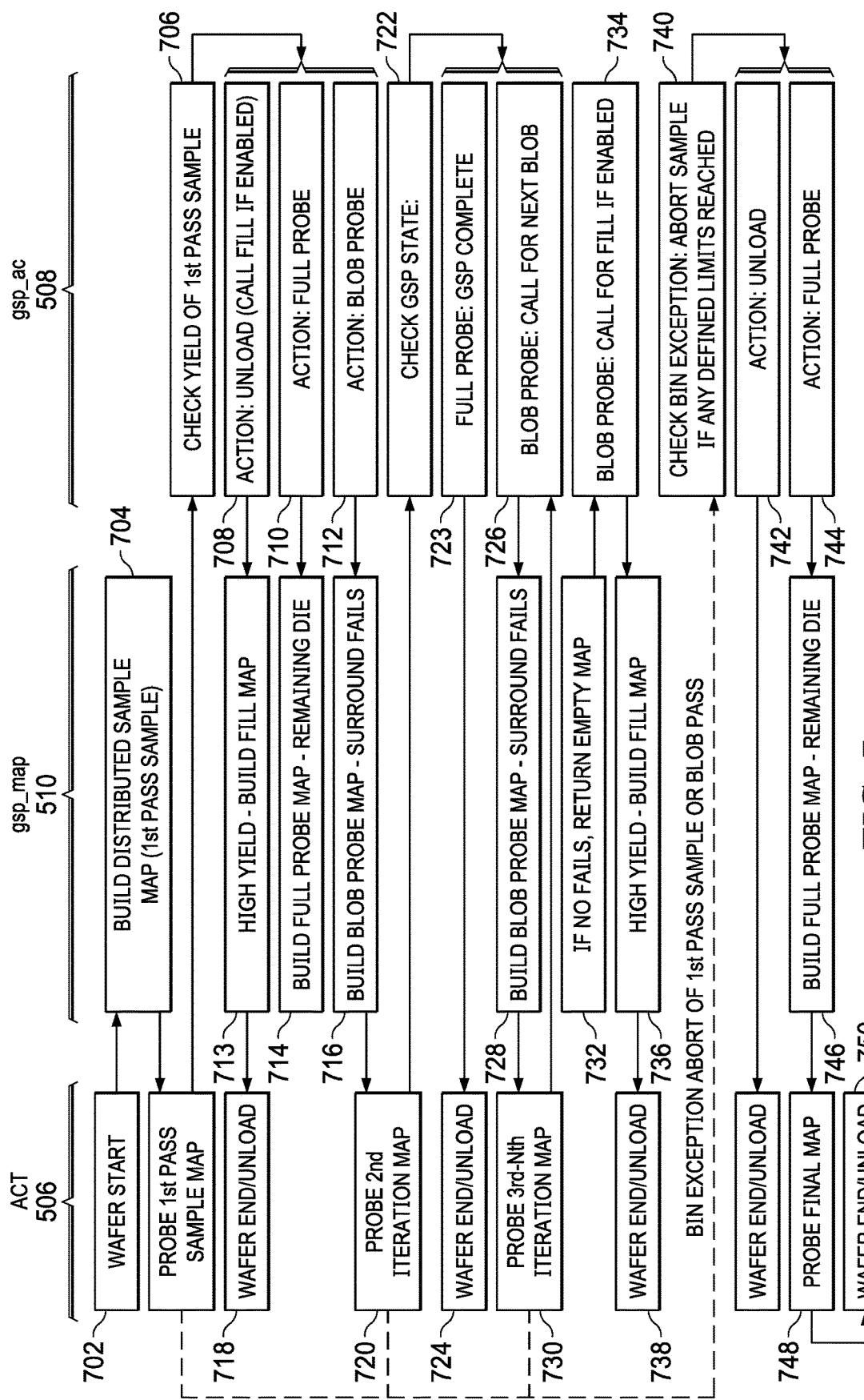
FIG. 7 illustrates a flowchart showing a GSP run flow.

FIG. 7 illustrates a flowchart showing the GSP run flow. The steps of the flowchart are located under elements 506, 508, 510, (also shown in FIG. 5) that execute that step.

With reference to FIG. 7, in connection with a GSP run process flow for testing wafer lots, a probe of a wafer is initiated (Wafer Start 702). A sampling map for conducting the wafer probe is constructed (build distributed Sample Map 704). This map determines the order number and identity of devices to be sampled on a wafer. It may be the case that, due to an interrupt, the wafer may not be fully probed as determined in connection with the build distributed Sample Map 704. However, where the sampling has been completed in connection with the initial sampling, this may be referred to as the completed 1$^{st}$ pass sample. Probing of the wafer under test follows according to the build distributed Sample Map 704. The yield of the 1st pass sample is checked (step 706) in connection with function gsp_ac 508, which may result in one of the following results based upon the yield result: unload the wafer from testing (step 708) (e.g., the yield may be high enough to release the wafer from testing, so as to result in a FILL operation as explained previously); engage in a full probe of the wafer (step 710); or engage in a blob probe (step 712) (probe surrounding die near a detected die determined to be unusable in connection with a probe) of the wafer. Each of the foregoing actions may result in building a corresponding probe map in connection with function gsp_map 510. Should a Fill operation occur in connection with a probe of a wafer, resulting in a high yield (step 713), the remaining untested die on a wafer are assumed to be acceptable and the current probe map is noted as such. The wafer under test is thereafter unloaded from the probe (step 718).

In connection with a full probe or a blob probe, a full probe map (step 714) or a blob probe map (step 716) is constructed, accordingly. A second probe (step 720) follows as a second iteration probe following the 1$^{st}$ iteration probe. This is followed by a check on the status of the probe (step 722). If a full probe has been completed (step 723), the wafer is unloaded from the testing equipment (step 724). If function gsp_ac 508 determines that a blob probe must follow (step 726), a blob probe map is constructed (step 728) by function gsp_map 510. A die is probed according to the blob probe map (step 730). Step 730 may occur iteratively depending on whether bin exception conditions are reached or full probe conditions are met as determined by function gsp_ac 508. Should the blob probe result in no fails (step 732) (i.e. the die probed during the blob probe are all found to be acceptable), a Fill operation may be called in connection with a step 734 (according to a blob probe). As with step 713, a Fill operation (step 736) follows step 734, resulting in the remaining untested die on a wafer are assumed to be acceptable and the current probe map is noted as such. In connection with the Fill operation, the wafer under test is unloaded at step 738.

Bin exceptions may be accounted for, as shown in step 740. In connection with a bin exception due to a 1$^{st}$ Pass Sample or a bin exception due to a blob probe (blob pass), either a wafer unload (e.g., disposal of a wafer) 742 and/or a full probe 744 is executed. The full probe 744 results from a full probe map 746. The full probe in step 744 may represent a final probe 748. The final probe map in step 748 will conclude with the wafer being unloaded in step 750.

Figure 8:
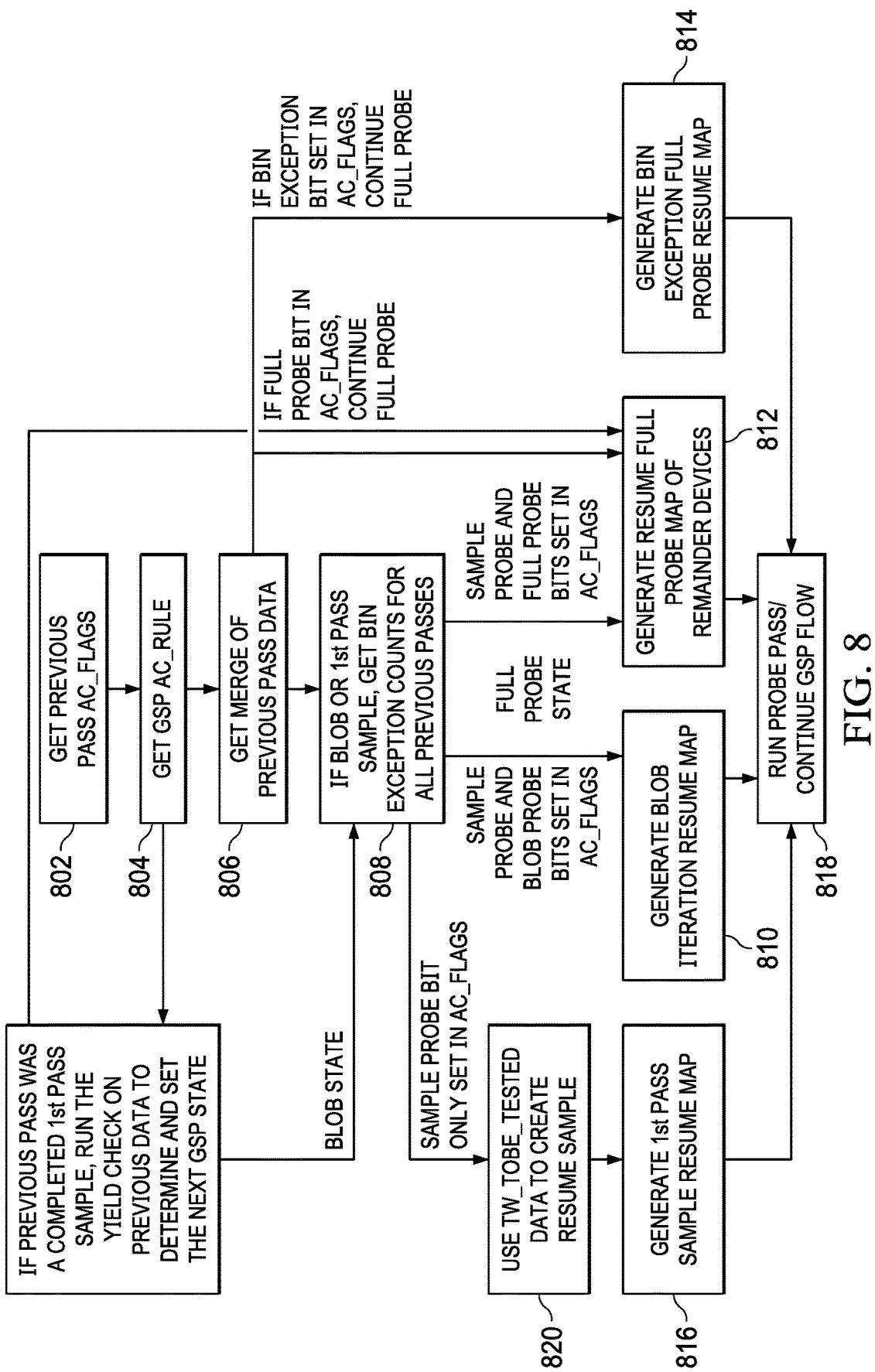
FIG. 8 illustrates a flowchart for resuming the testing of die on a wafer after an interrupt.

FIG. 8 illustrates a flowchart for resuming the testing of die on a wafer after an interrupt, referred to herein as a resume flow. The following pertains to FIG.8 and FIG. 5: In connection with a probe interrupt, in step 802, the bit settings, such as AC_Flags, for a pertinent interrupted wafer probe are retrieved by function gsp_map 510 of FIG. 5. The probe interrupt may occur in connection with the probe testing of die on one wafer being interrupted in favor of testing die on another wafer. In step 804, the probe map rules employed by function GSP Rule are retrieved by function gsp_map 510. As previously interrupted wafer probe data was merged into a database, such as may be found in memory segment 512, at step 806, this wafer probe data is retrieved by the gsp_map 510 function. At step 808, the bin exception counts are collected for analysis by the function gsp_ac 508. In the case that the sample probe bit (FIG. 6) is set (indicating that probe sampling is to occur) in addition to the blob probe bit being set (indicating that a blob probe is in effect for the previously interrupted wafer probe), a blob probe probe map is constructed by function gsp_map 510 as a resume map. Probing of the wafer occurs in connection with the blob probe resume map in step 810 (run probe pass). Where the sample probe and full probe bits are set in AC_Flags, in connection with step 808, a full probe resume map is generated in step 812 by function gsp_map 510. Thereafter, in step 818, a full probe follows according to the full probe resume map. Where only the sample probe bit is set for the interrupted previous probe, in connection with step 808, a probe resume map is generated at step 816 from the data indicative of die yet to be tested in the previously interrupted probe as indicated in step 820. In the case where the full probe bit is set at step 806, a full probe resume map is generated by function gsp_ map 510 at step 812. Thereafter, a full probe of the wafer occurs according to full probe resume map in step 818. In the case where the previous probe data indicates the existence of a bin exception through the bin exception flag being set in AC_Flags, then a full probe resume map is generated in step 814 which is followed by a full probe of the wafer as indicated in step 818.

System 110 (as shown in FIG. 1 and FIG. 5) may implement the starting probe map according to an initial sample plan, for sampling die on a wafer according a variety of different methods employing different distribution patterns. For instance, the sampling, according to the first probe of a wafer may implement a probe of every x die on the wafer, where x is an integer greater than one. As probe results are collected, system 110 may change the sampling pattern to increase the number of probed die on a wafer or decrease the number of probed die on a wafer. The sample plan may also implement sampling by probing according to patterns with probing starting on various locations on a wafer or implementing sampling on only certain areas of a wafer. For instance, the areas near the center or the edges of a wafer may be sampled more often in a probe according to a sample plan and the plan may be changed over time in response to the sampling results received.

Various sampling schemes may be used in a sample plan implemented by system 110. For example, sampling schemes implement probability sampling or non-probability sampling may be used. In some examples, sampling schemes may be implemented by a sampling plan according to the following: simple random sampling; cluster sampling; stratified sampling systematic sampling or multistage sampling wherein one or more of the foregoing schemes are implement as stages of a combination of stages.

System 110 may be used to implement various quality control metrics. For instance, system 110 may be used to implement a 6 Sigma® methodology of improving wafer/die process control and manufacturing.

The system of the examples presented or portions of the system thereof may be in the form of a "processing machine," such as a general-purpose computer, special purpose processor or microcontroller, for example. As used herein, the term "processing machine" may be understood to include at least one processor that uses at least one memory. The at least one memory stores a set of instructions. The instructions may be either permanently or temporarily stored in the memory or memories of the processing machine. The processor executes the instructions that are stored in the memory or memories in order to process data. The set of instructions may include various instructions that perform a particular task or tasks, such as those tasks described above. Such a set of instructions for performing a particular task may be characterized as a program, software program, or simply software.

As noted above, the processing machine executes the instructions that are stored in the memory or memories to process data. This processing of data may be in response to commands by a user or users of the processing machine, in response to previous processing, in response to a request by another processing machine and/or any other input, for example.

As noted above, the processing machine used to implement some examples may be a general purpose computer. However, the processing machine described above may also utilize any of a wide variety of other technologies including a special purpose computer, a computer system including, for example, a microcomputer, mini-computer or mainframe, a programmed microprocessor, a micro-controller, a peripheral integrated circuit element, a CSIC (Customer Specific Integrated Circuit) or ASIC (Application Specific Integrated Circuit) or other integrated circuit, a logic circuit, a digital signal processor, a programmable logic device ("PLD") such as a Field-Programmable Gate Array ("FPGA"), Programmable Logic Array ("PLA"), or Programmable Array Logic ("PAL"), or any other device or arrangement of devices that is capable of implementing the steps of the processes described The processing machine used to implement the foregoing may utilize a suitable operating system. Thus, examples herein may include a processing machine running the iOS operating system, the OS X operating system, the Android operating system, the Microsoft Windows™ 10 operating system, the Microsoft Windows™ 8 operating system, Microsoft Windows™ 7 operating system, the Microsoft Windows™ Vista™ operating system, the Microsoft Windows™ XP™ operating system, the Microsoft Windows™ NT™ operating system, the Windows™ 2000 operating system, the Unix operating system, the Linux operating system, the Xenix operating system, the IBM AIX™ operating system, the Hewlett-Packard UX™ operating system, the Novell Netware™ operating system, the Sun Microsystems Solaris™ operating system, the OS/2™ operating system, the BeOS™ operating system, the various Apple iPhone and MacOS operating systems, the Apache operating system, an OpenStep™ operating system or another operating system or platform.

Further, various technologies may be used to provide communication between the various processors and/or memories, as well as to allow the processors and/or the memories to communicate with any other entity, i.e., so as to obtain further instructions or to access and use remote memory stores, for example. Such technologies used to provide such communication might include a network, the Internet, Intranet, Extranet, LAN, an Ethernet, wireless communication via cell tower or satellite, or any client server system that provides communication, for example. Such communications technologies may use any suitable protocol such as TCP/IP, UDP, or OSI, for example.

As described above, a set of instructions may be used in the processing of the foregoing. The set of instructions may be in the form of a program or software. The software may be in the form of system software or application software, for example. The software might also be in the form of a collection of separate programs, a program module within a larger program, or a portion of a program module, for example. The software used might also include modular programming in the form of object-oriented programming. The software tells the processing machine what to do with the data being processed.

Further, it is appreciated that the instructions or set of instructions used in the implementation and operation of the foregoing may be in a suitable form such that the processing machine may read the instructions. For example, the instructions that form a program may be in the form of a suitable programming language, which is converted to machine language or object code to allow the processor or processors to read the instructions. That is, written lines of programming code or source code, in a particular programming language, are converted to machine language using a compiler, assembler or interpreter. The machine language is binary coded machine instructions that are specific to a particular type of processing machine, i.e., to a particular type of computer, for example. The computer understands the machine language.

Any suitable programming language may be used in accordance with the various examples of the foregoing Illustratively, the programming language used may include assembly language, Ada, APL, Basic, C, C++, COBOL, dBase, Forth, Fortran, Java, Modula-2, Pascal, Prolog, REXX, Visual Basic, and/or JavaScript, for example. Further, it is not necessary that a single type of instruction or single programming language be utilized in conjunction with the operation of the system and method of the foregoing. Rather, any number of different programming languages may be utilized as is necessary and/or desirable.

Also, the instructions and/or data used in the practice of the examples may utilize any compression or encryption technique or algorithm, as may be desired. An encryption module might be used to encrypt data. Further, files or other data may be decrypted using a suitable decryption module, for example.

As described above, some examples may illustratively be embodied in the form of a processing machine, including a computer or computer system, for example, that includes at least one memory. It is to be appreciated that the set of instructions, i.e., the software for example, that enables the computer operating system to perform the operations described above may be contained on any of a wide variety of media or medium, as desired. Further, the data that is processed by the set of instructions might also be contained on any of a wide variety of media or medium. That is, the particular medium, i.e., the memory in the processing machine, utilized to hold the set of instructions and/or the data used in the examples may take on any of a variety of physical forms or transmissions, for example. Illustratively, the medium may be in the form of paper, paper transparencies, a compact disk, a DVD, an integrated circuit, a hard disk, a floppy disk, an optical disk, a magnetic tape, a RAM, a ROM, a PROM, an EPROM, a wire, a cable, a fiber, a communications channel, a satellite transmission, a memory card, a SIM card, or other remote transmission, as well as any other medium or source of data that may be read by processors.

Further, the memory or memories used in the processing machine that implement the foregoing may be in any of a wide variety of forms to allow the memory to hold instructions, data, or other information, as is desired. Thus, the memory might be in the form of a database to hold data. The database might use any desired arrangement of files such as a flat file arrangement or a relational database arrangement, for example.

The foregoing has been described herein using specific examples for the purposes of illustration only. It will be readily apparent to one of ordinary skill in the art, however, that the principles of the described herein may be embodied in other ways. Therefore, the foregoing should not be regarded as being limited in scope to the specific examples disclosed herein, but instead as being fully commensurate in scope with the following claims.

We claim:

1. A method of resuming probing of a wafer, in connection with random, distributed or statistical wafer probing, following an interruption of a previous probe, comprising the following steps:
    (a) receiving parameter settings corresponding to one or more previous probes;
    (b) receiving probe map making rules;
    (c) collecting probe data corresponding to one or more previous probes;
    (d) checking for yield data exceptions;
    (e) checking for limit value exceptions;
    (f) generating a resume probe map subject to probe map making rules concerning yield data and limit value exceptions; and
    (g) probing the wafer according to the resume probe map.

2. The method as recited in claim 1 wherein the parameter settings are microcontroller register settings.

3. The method of resuming probing of a wafer as recited in claim 2 wherein the register settings consist of settings selected from those indicative of a full probe, a blob probe, a bin exception, a fill operation and combinations thereof.

4. The method of resuming probing of a wafer as recited in claim 1, wherein the previous probe is generated from a probe map specifying a probe of fewer than all die on the wafer.

5. The method of resuming probing of a wafer as recited in claim 1 further comprising iteratively performing steps (a) through (g) in claim 1 until after encountering a full probe, the yield data exception, the limit value exception, probe completion or probe interruption.

6. The method of resuming probing of a wafer as recited in claim 1 wherein the resume probe map corresponds to a full probe map in conjunction with the parameter settings indicating a full probe.

7. The method of resuming probing of a wafer as recited in claim 1 wherein the resume probe map corresponds to a blob probe map in conjunction with the parameter settings indicating a blob probe.

8. The method of resuming probing of a wafer, as recited in claim 1, wherein the resume probe map corresponds to a full probe map in conjunction with the probe data corresponding to the previous probe indicating a bin exception occurrence.

9. The method of resuming probing of a wafer, as recited in claim 1, wherein a resume map is generated in response to a sample probe parameter being set.

10. The method of resuming probing of a wafer, as recited in claim 1, which further comprises removing the wafer from a test setup in response to a completion of the wafer probing in conjunction with attaining the limit value exception.

11. The method of resuming probing of a wafer, as recited in claim 1, which further comprises removing the wafer from a test setup in response to a completion of the wafer probing in conjunction with attaining the yield data exceptions a yield exception value.

12. A non-transitory, computer-readable, programmable product, for use in conjunction with a programmable logic controller comprising code, executable by the programmable logic controller, for causing the programmable logic controller to do the following in connection with random, distributed or statistical wafer probing:
    collect parameter settings corresponding to a previous probe of a wafer;

collect, from memory, probe map making rules;

collect, from memory, probe data corresponding to the previous probe;

check for yield data exceptions;

check for limit value exceptions;

generate a resume probe map, based on collected probe data and collected parameter settings, subject to probe map making rules concerning yield data and limit value exceptions; and cause a probe of the wafer according to the resume probe map.

13. The non-transitory, computer-readable, programmable product, as recited in claim 12, further comprising code for causing the programmable logic controller to produce a probe map for an initial sampling plan based on statistical sampling of fewer than all die on a wafer.

14. The non-transitory, computer-readable, programmable product, as recited in claim 13, further comprising code for causing the programmable logic controller to alter the initial sampling plan based upon probe results.

15. The non-transitory, computer-readable, programmable product, as recited in claim 13, wherein the initial sampling plan is based on a statistical sampling scheme selected from the group consisting of simple random sampling; cluster sampling; stratified sampling systematic sampling and multistage sampling.

16. The non-transitory, computer-readable, programmable product, as recited in claim 15, further comprising code for causing the programmable logic controller to alter the sampling plan based upon probe results.

17. The non-transitory, computer-readable, programmable product, as recited in claim 12 wherein the parameter settings are microprocessor register settings.

18. A non-transitory, computer-readable, programmable product, for use in conjunction with a microprocessor comprising code, executable by the microprocessor, for causing the microprocessor to do the following in connection with random, distributed or statistical wafer probing:

collect parameter settings corresponding to a previous probe of a wafer;

collect, from memory, probe map making rules;

collect, from memory, probe data corresponding to the previous probe;

check for yield data exceptions;

check for limit value exceptions;

generate a resume probe map, based on collected probe data and collected parameter settings, subject to probe map making rules concerning yield data and limit value exceptions; and cause a probe of the wafer according to the resume probe map.

19. The non-transitory, computer-readable, programmable product, as recited in claim 18, further comprising code for causing the microprocessor to produce a probe map for an initial sampling plan that causes a probe of the wafer based on statistical sampling of fewer than all die on a wafer.

20. The non-transitory, computer-readable, programmable product, as recited in claim 19, further comprising code for causing the microprocessor to cause a probe of the wafer according to a statistical sampling scheme, implemented according to the initial sampling plan, selected from the group consisting of simple random sampling; cluster sampling; stratified sampling systematic sampling and multistage sampling.

* * * * *